US012581601B2

(12) United States Patent
Lim

(10) Patent No.: US 12,581,601 B2
(45) Date of Patent: Mar. 17, 2026

(54) REEL-TO-REEL CIRCUIT BOARD MANUFACTURING APPARATUS

(71) Applicant: HAESUNG DS CO., LTD., Gyeongsangnam-do (KR)

(72) Inventor: Hyun Tae Lim, Gyeongsangnam-do (KR)

(73) Assignee: HAESUNG DS CO., LTD, Gyeongsangnam-Do (KR)

( * ) Notice: Subject to any disclaimer, the term of this patent is extended or adjusted under 35 U.S.C. 154(b) by 801 days.

(21) Appl. No.: 17/930,454

(22) Filed: Sep. 8, 2022

(65) Prior Publication Data

US 2023/0101713 A1 Mar. 30, 2023

(30) Foreign Application Priority Data

Sep. 30, 2021 (KR) .......................... 10-2021-0130303

(51) Int. Cl.
*H05K 3/00* (2006.01)

(52) U.S. Cl.
CPC ......... *H05K 3/0097* (2013.01); *H05K 3/0085* (2013.01); *H05K 2203/1509* (2013.01); *H05K 2203/1545* (2013.01)

(58) Field of Classification Search
CPC . H05K 3/0085; H05K 3/0097; H05K 2203/15
See application file for complete search history.

(56) References Cited

U.S. PATENT DOCUMENTS

| | | | | |
|---|---|---|---|---|
| 10,842,025 | B1 * | 11/2020 | Lane | ...................... B23K 26/16 |
| 2019/0026613 | A1 * | 1/2019 | O'Shea | ........... G06K 19/06187 |
| 2019/0133009 | A1 * | 5/2019 | Kurayama | ............. H05K 13/02 |
| 2021/0092853 | A1 | 3/2021 | Lane | |

FOREIGN PATENT DOCUMENTS

| | | | | |
|---|---|---|---|---|
| CN | 205946509 | | 2/2017 | |
| JP | 2013207140 | A * | 1/2013 | ............... H05K 3/46 |
| KR | 102000988 | B1 * | 7/2019 | ......... H01L 21/6773 |
| TW | 201500136 | | 1/2015 | |

OTHER PUBLICATIONS

KR102000988 Translation (Year: 2019).*

* cited by examiner

*Primary Examiner* — Woody A Lee, Jr.
(74) *Attorney, Agent, or Firm* — Perman & Green, LLP

(57) ABSTRACT

A reel-to-reel circuit board manufacturing apparatus according to an embodiment of the present disclosure includes: a material which is moved while being wound and unwound by an uncoiler and a recoiler, and a clamp that is arranged so that a width direction of the material matches a lengthwise direction thereof, and is configured to fix the material, wherein the clamp includes a first clamp and a second clamp formed on opposite ends thereof, and a first-and-second clamp linkage formed between the first and second clamps.

10 Claims, 6 Drawing Sheets

PERPENDICULAR DIRECTION

WIDTH DIRECTION

PROCEEDING DIRECTION

PERPENDICULAR DIRECTION

WIDTH DIRECTION

PROCEEDING DIRECTION

REEL-TO-REEL CIRCUIT BOARD MANUFACTURING APPARATUS

CROSS-REFERENCE TO RELATED APPLICATION

This application is based on and claims priority under 35 U.S.C. § 119 to Korean Patent Application No. 10-2021-0130303, filed on Sep. 30, 2021, in the Korean Intellectual Property Office, the disclosure of which is incorporated by reference herein in its entirety.

BACKGROUND

1. Field

One or more embodiments of the disclosure relate to a reel-to-reel circuit board manufacturing apparatus.

2. Description of the Related Art

According to the related art, methods of manufacturing a printed circuit board include a method of manufacturing a multi-layer printed circuit board of a panel type. As a process of manufacturing a general printed circuit board from among interlayer bonding methods for manufacturing multi-layer printed circuit boards (PCBs), the method of manufacturing the multi-layer printed circuit board of the panel type consists of a lay-up process in which materials to be bonded are sequentially stacked, and a lamination process in which laid-up materials are bonded to each other by using heat and pressure.

However, according to a plating technology of the panel type, there is a large thickness variation between panels, and even in one panel, there is a large thickness variation according to location. In addition, due to the nature of the material of a thin plate product, it is difficult to automate processes, and thus, damages occur a lot during the processes and defects caused by an operator also occur.

SUMMARY

One or more embodiments provide a reel-to-reel circuit board manufacturing apparatus capable of manufacturing a circuit board in a reel-to-reel continuous plating method.

However, the above technical features are exemplary, and the scope of the disclosure is not limited thereto.

Additional aspects will be set forth in part in the description which follows and, in part, will be apparent from the description, or may be learned by practice of the presented embodiments of the disclosure.

A reel-to-reel circuit board manufacturing apparatus includes: a material which is moved while being wound and unwound by an uncoiler and a recoiler, and a clamp that is arranged so that a width direction of the material matches a lengthwise direction thereof, and fixes the material, wherein the clamp includes a first clamp and a second clamp formed on opposite ends thereof, and a first-and-second clamp linkage formed between the first and second clamps.

The first-and-second clamp linkage may have an elastic body that provides a tension between the first and second clamps.

The first-and-second clamp linkage may have a magnet portion so as to provide a tension between the first and second clamps.

The clamp may include a plurality of clamps arranged at constant intervals along a direction in which the material proceeds.

The clamp may include a clamp arm connected to the clamp for fixing the clamp, and the clamp arm may be attachable to/detachable from the clamp.

The clamp arm may be attachable/detachable while moving in a direction perpendicular to the clamp.

The clamp arm may include a first clamp arm connected to the first clamp and a second clamp arm connected to the second clamp, and the first clamp arm and the second clamp arm may be attached/detached separately from each other.

The clamp arm may have a variable length.

The reel-to-reel circuit board manufacturing apparatus may further include a clamp support formed along the direction in which the material proceeds, wherein the clamp may be connected to the clamp support.

The reel-to-reel circuit board manufacturing apparatus may further include a rail portion formed on the clamp support along the direction in which the material proceeds, wherein the clamp may be connected to the rail portion, and the clamp may be moved along the rail portion.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
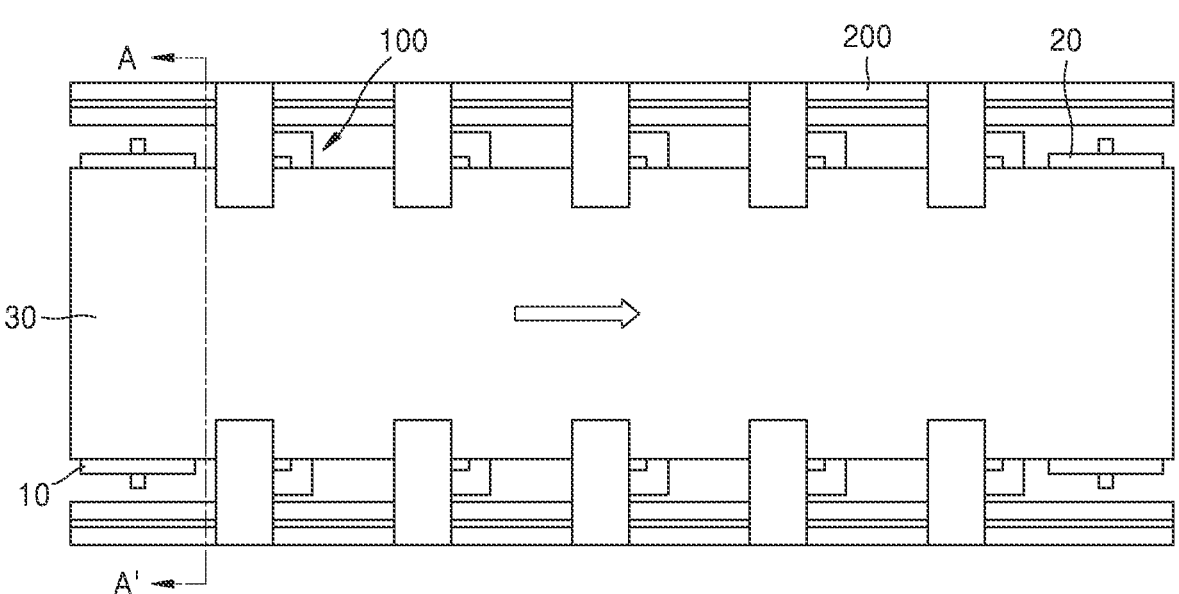
FIG. 1 is a diagram showing a top view of a reel-to-reel circuit board manufacturing apparatus according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in detail in the written description. However, this is not intended to limit the present disclosure to particular modes of practice, and it is to be appreciated that all modifications, equivalents, and/or alternatives that do not depart from the spirit and technical scope are encompassed in the disclosure. In describing the present disclosure, like reference numerals denote the same elements even when the elements are provided in another embodiment.

The embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

The terms used in the present specification are merely used to describe particular embodiments, and are not intended to limit the present disclosure. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, referring to FIGS. 1 to 4, a reel-to-reel circuit board manufacturing apparatus according to an embodiment of the present disclosure will be described below.

Figure 2:
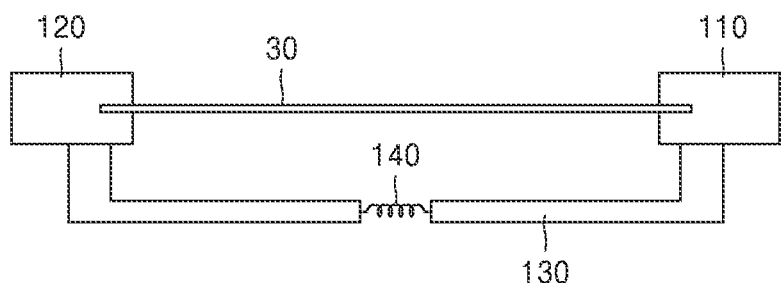
FIG. 2 is a cross-sectional view of a clamp taken along line A-A' of FIG. 1 according to an embodiment of the present disclosure.
Figure 3:
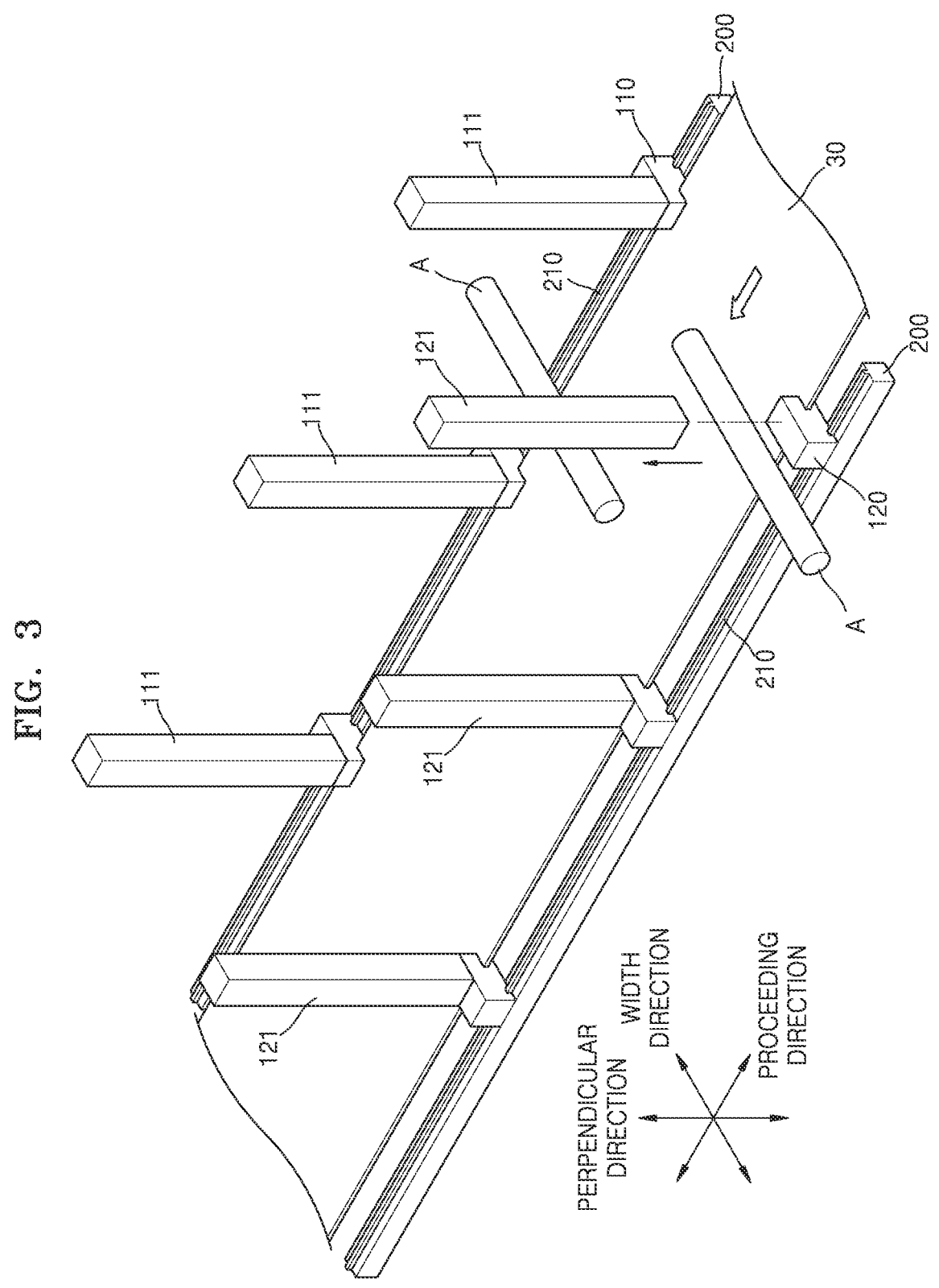
FIG. 3 is a diagram illustrating a vertical movement structure of one clamp arm due to an obstacle, according to an embodiment of the present disclosure.
Figure 4:
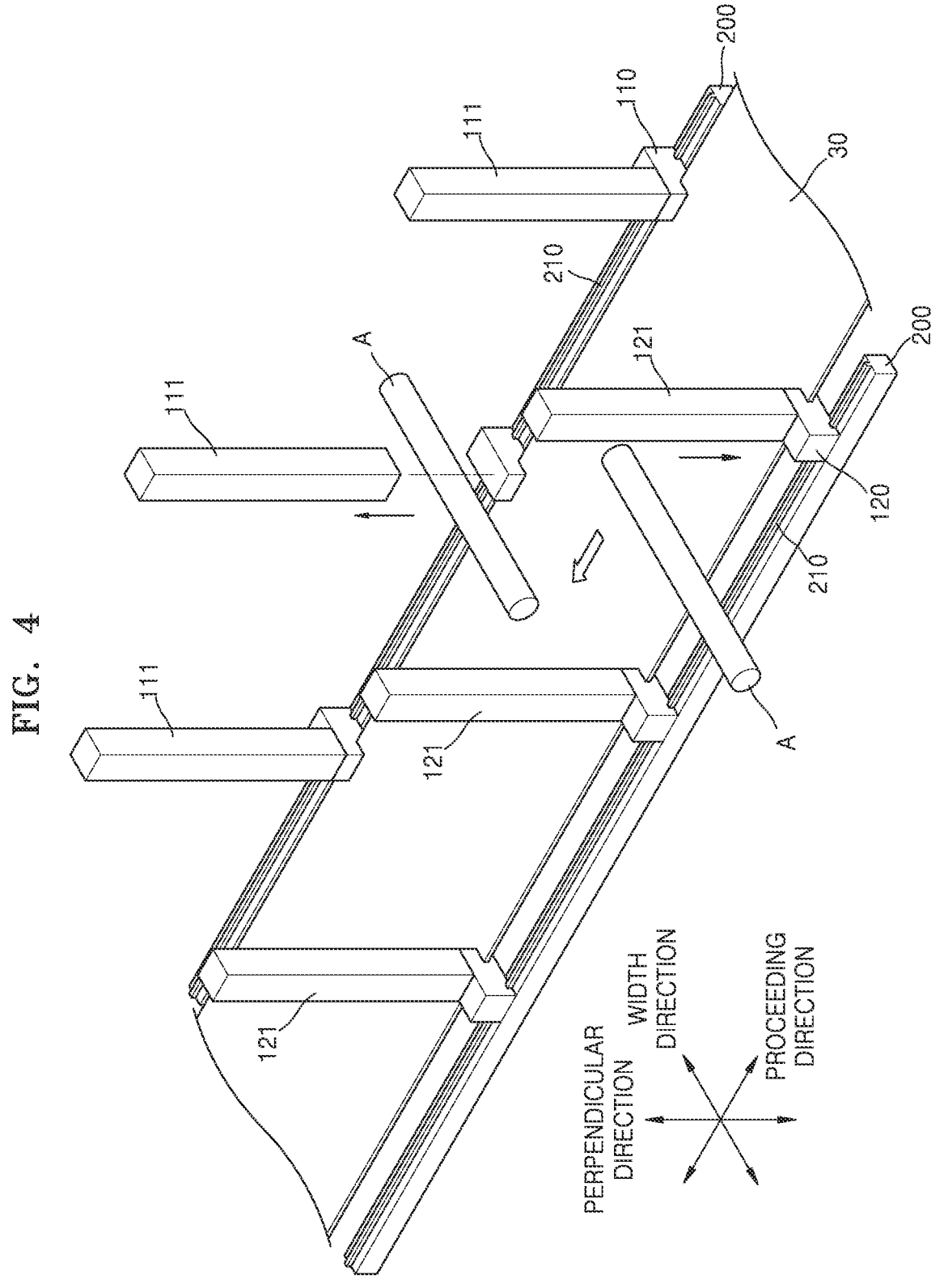
FIG. 4 is a diagram illustrating a vertical movement structure of another clamp arm when a material is moved from the state shown in FIG. 3.

FIG. 1 is a diagram showing a reel-to-reel circuit board manufacturing apparatus according to an embodiment of the present disclosure seen from above. FIG. 2 is a cross-sectional view showing a clamp taken along line A-A' of FIG. 1 according to an embodiment of the present disclosure. FIG. 3 is a diagram illustrating a vertical movement structure of one clamp arm due to an obstacle, according to an embodiment of the present disclosure. FIG. 4 is a diagram illustrating a vertical movement structure of another clamp arm when a material is moved from the state shown in FIG. 3.

Referring to FIGS. 1 to 4, the reel-to-reel circuit board manufacturing apparatus according to an embodiment of the present disclosure includes a material 30 that is moved while being unwound and wound by an uncoiler 10 and a recoiler 20, and a clamp 100 that is arranged so that a lengthwise direction thereof matches a width direction of the material 30 and fixes the material 30. The clamp 100 includes first and second clamps 110 and 120 provided at opposite ends thereof, and a first-and-second clamp linkage 130 provided between the first and second clamps 110 and 120.

The clamp 100 may fix the material 30 from the opposite ends in the width direction of the material 30. Because the material 30 is moved while the opposite ends in the width direction thereof are fixed by the clamp 100, the material may be stably moved and a plating process may be stably performed through driving, to thereby improve efficiency of manufacturing the circuit board. A plurality of clamps 100 may be arranged along a proceeding direction of the material 30 at constant intervals.

The first and second clamps 110 and 120 fixing the opposite ends of the material 30 may be connected to each other under the material through the first-and-second clamp linkage 130. The first-and-second clamp linkage 130 is provided under the material 30 and support a middle part of the material 30.

According to an embodiment of the present disclosure, as shown in FIG. 2, the first-and-second clamp linkage 130 may include an elastic body 140. The elastic body 140 provides elasticity between the first and second clamps 110 and 120 so that the elasticity may be applied in the direction in which the first and second clamps 110 and 120 are away from each other, and thus, the material 30 may be held from opposite sides without forming crinkles.

Referring to FIG. 3, the clamp 100 may include first and second clamp arms 111 and 121 that are connected to the clamp 100 to fix the clamp 100. The first clamp arm 111 may be connected to the first clamp 110, and the second clamp arm 121 may be connected to the second clamp 120.

The first and second clamp arms 111 and 121 move the clamp 100 so that the material 30 coupled to the clamp 100 may be moved in the proceeding direction.

According to an embodiment of the present disclosure, as shown in FIG. 3, the first and second clamp arms 111 and 121 may be attached to/detached from the clamp 100. Here, the first and second clamp arms 111 and 121 may be attached to/detached from the clamp 100 while moving in the direction perpendicular to the clamp 100.

As described above, the first and second clamp arms 111 and 121 may have attachable/detachable structures so as to avoid an obstacle A such as a piping or a wiring. Referring to FIGS. 3 and 4, the first clamp arm 111 and the second clamp arm 121 may be separately attached/detached. That is, when an obstacle exists above one side of the material 30, the first clamp arm 111 at one side of the material 30 may be only separated from the first clamp 110. Also, when an obstacle exists above the other side of the material 30, the second clamp arm 121 at the other side of the material 30 may be only separated from the second clamp 120.

According to an embodiment of the present disclosure, a clamp support 200 may be further provided along the direction in which the material 30 proceeds. The clamp support 200 may be connected to the clamp 100 and supports the clamp 100 to position the clamp 100.

Referring to FIGS. 3 and 4, the clamp support 200 may further include a rail portion 210 that is formed along the proceeding direction of the material 30. Here, the clamp 100 is connected to the rail portion 210, and may be moved along the rail portion 210.

When the first and second clamp arms 111 and 121 are moved in the proceeding direction, the clamp 100 connected to the clamp arms 111 and 121 may be moved in the proceeding direction along the rail portion 210. Here, the material 30 fixed by the clamp 100 may be also moved in the proceeding direction.

As described above, when the obstacle A approaches the first and second clamp arms 111 and 121 moving along the rail portion 210, the first and second clamp arms 111 and 121 are separated from the first and second clamps 110 and 120. In addition, when the obstacle A passes by, the first and second clamp arms 111 and 121 are recombined with the first and second clamps 110 and 120. Due to the above structure, the material 30 may be stably moved in the proceeding direction.

Hereinafter, a reel-to-reel circuit board manufacturing apparatus according to another embodiment of the present disclosure will be described with reference to FIG. 5.

Figure 5:
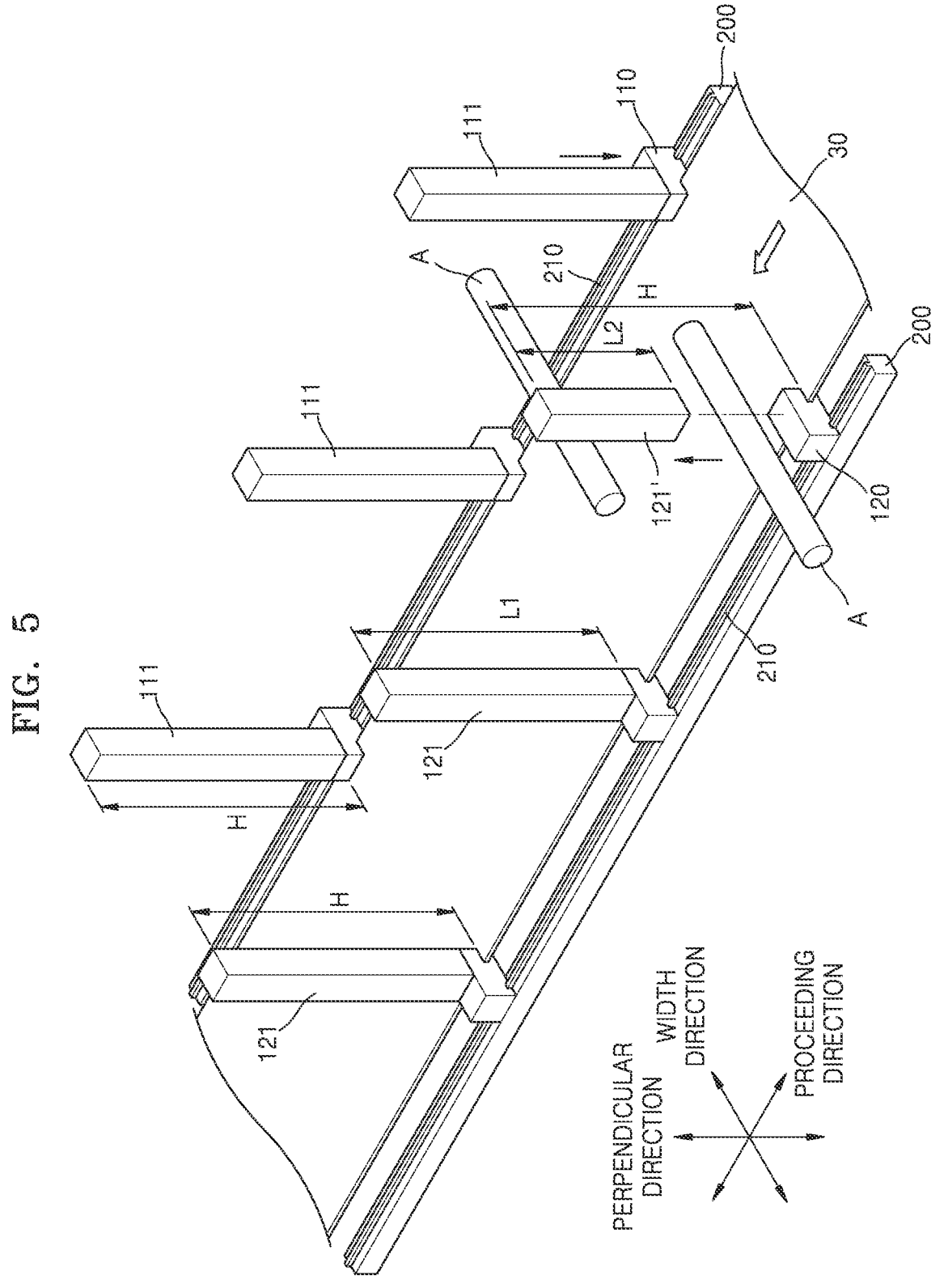
FIG. 5 is a diagram illustrating a structure of adjusting a length of a clamp arm according to another embodiment of the present disclosure.

FIG. 5 is a diagram illustrating a structure of adjusting a length of a clamp arm according to another embodiment of the present disclosure.

Referring to FIG. 5, in the reel-to-reel circuit board manufacturing apparatus according to another embodiment of the present disclosure, when a clamp arm 121' is separated from the clamp 120, a length of the clamp arm 121' may be variable. As such, a length L2 of the clamp arm 121' separated from the clamp may be less than a length L1 of the second clamp arm 121 coupled to the clamp.

In particular, a lower end of the clamp arm 121' may be moved upward, and an upper end of the clamp arm 121' may be maintained at the same position as that before the separation. That is, even when the clamp arm 121' is separated from the clamp 100, the upper end of the clamp arm 121' is maintained constantly. Thus, heights H of the upper ends in a plurality of clamp arms 111, 121, and 121' are equal to one another, and it may be designed so that the clamp arm 121' may be attached to/detached from the clamp 100 while a moving portion (not shown) that is connected to the upper ends of the plurality of clamp arms 111, 121, and 121' and moves the clamp arms in the proceeding direction is maintained to be connected to the clamp arms 111, 121, and 121'.

Hereinafter, a clamp having a magnet portion formed thereon according to another embodiment of the present disclosure will be described below with reference to FIG. 6.

Figure 6:
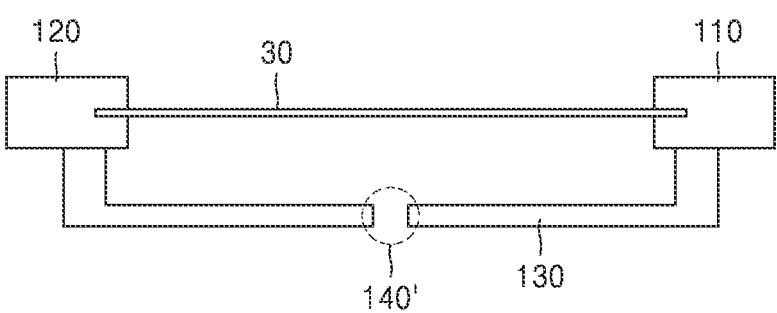
FIG. 6 is a cross-sectional view of a clamp taken along line A-A' of FIG. 1, the clamp having a magnet portion formed thereon according to another embodiment of the present disclosure.

FIG. 6 is a diagram showing a clamp on which a magnet portion is formed, according to another embodiment of the present disclosure.

Referring to FIG. 6, in a reel-to-reel circuit board manufacturing apparatus according to another embodiment of the present disclosure, the first-and-second clamp linkage 130 has a magnet portion 140' so as to provide a tension between the first and second clamps 110 and 120. The magnet portion 140' may have a structure including a magnetic material such as an electromagnet. As such, information about a degree of tension required by a user is transferred to the magnet portion 140' so that a tensile force is applied due to a magnetic force between the first and second clamps 110 and 120, and accordingly, a degree of straightening the material 30 fixed by the first and second clamps 110 and 120 may be adjusted.

The present disclosure is described above with reference to the embodiments shown in the drawings, but these embodiments are merely examples. One of ordinary skill in the art would understand that various modifications and other equivalent embodiments may be made from the embodiments. Therefore, the scope sought to be protected of the disclosure shall be defined by the appended claims.

The particular implementations shown and described herein are illustrative examples of the embodiments and are not intended to otherwise limit the scope of the embodiments in any way. In order to simply and clearly describe the disclosure, the description of the general technology and structure according to the related art may be omitted.

Furthermore, the connecting lines or connectors shown in the drawings are intended to represent example functional relationships and/or physical or logical couplings between the various elements. It should be noted that many alternative or additional functional relationships, physical connections, or logical connections may be present in a practical device. Moreover, no item or component is essential to the practice of the disclosure unless the element is specifically described as "essential" or "critical".

Throughout the specification, in particular, in claims, "the" or other similar referring expressions may refer to both a singular form and a plural form. Unless otherwise defined, the ranges defined herein is intended to include values within the range as individually applied and may be considered to be the same as individual values constituting the range in the detailed description.

Also, operations constituting methods may be performed in appropriate order unless explicitly described in terms of order or described to the contrary. Exemplary embodiments are not necessarily limited to the order of operations given in the description. The examples or exemplary terms (for example, etc.) used herein are to merely describe exemplary embodiments in detail are not intended to limit the embodiments unless defined by the following claims. Also, those of ordinary skill in the art will readily appreciate that many alternations, combinations and modifications, may be made according to design conditions and factors within the scope of the appended claims and their equivalents.

According to the reel-to-reel circuit board manufacturing apparatus according to an embodiment of the present disclosure, a product may be wound and unwound in a reel-to-reel manner by using an uncoiler and a recoiler, and then, a circuit board may be manufactured through an automated process by a continuous plating method.

In the reel-to-reel circuit board manufacturing apparatus according to an embodiment of the present disclosure, the material is fixed by using the clamps provided on opposite sides in the width direction, and thus, the process may be performed while stably moving the material.

Also, in the reel-to-reel circuit board manufacturing apparatus according to an embodiment of the present disclosure, the clamp arms on opposite sides may have a variable structure so as to avoid an obstacle such as a piping, a wiring, etc.

Also, in the reel-to-reel circuit board manufacturing apparatus according to an embodiment of the present disclosure, a spring or a magnet portion is provided on the linkage that connects the clamps so as to apply a desired level of tension to the material.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A reel-to-reel circuit board manufacturing apparatus comprising:

a material that is moved while being unwound and wound by an uncoiler and a recoiler; and a clamp arranged so that a width direction of the material matches a lengthwise direction thereof, and configured to fix the material, wherein the clamp comprises:

first and second clamps formed on opposite ends thereof; and a first-and-second clamp linkage formed between the first and second clamps and configured to provide a tension between the first and second clamps such that a distance between the first and second clamps is adjustable in the width direction of the material.

2. The reel-to-reel circuit board manufacturing apparatus of claim 1, wherein the first-and-second clamp linkage has an elastic body that provides the tension between the first and second clamps.

3. The reel-to-reel circuit board manufacturing apparatus of claim 1, wherein the first-and-second clamp linkage has a magnet portion so as to provide the tension between the first and second clamps.

4. The reel-to-reel circuit board manufacturing apparatus of claim 1, wherein the clamp includes a plurality of clamps arranged at constant intervals along a direction in which the material proceeds.

5. The reel-to-reel circuit board manufacturing apparatus of claim 1, further comprising a clamp arm configured to be connected to the clamp for fixing the clamp, wherein the clamp arm is attachable to/detachable from the clamp.

6. The reel-to-reel circuit board manufacturing apparatus of claim 5, wherein the clamp arm is attachable/detachable while moving in a direction perpendicular to the clamp.

7. The reel-to-reel circuit board manufacturing apparatus of claim 5, wherein the clamp arm includes a first clamp arm configured to be connected to the first clamp; and a second clamp arm configured to be connected to the second clamp, and the first clamp arm and the second clamp arm are attached/detached to a respective one of the first clamp and second clamp separately from each other.

8. The reel-to-reel circuit board manufacturing apparatus of claim 5, wherein the clamp arm has a variable length.

9. The reel-to-reel circuit board manufacturing apparatus of claim 1, further comprising a clamp support formed along the direction in which the material proceeds, wherein the clamp is connected to the clamp support.

10. The reel-to-reel circuit board manufacturing apparatus of claim 9, further comprising a rail portion formed on the clamp support along the direction in which the material proceeds, wherein the clamp is connected to the rail portion, and the clamp is moved along the rail portion.

\* \* \* \* \*